United States Patent
Pei et al.

(10) Patent No.: US 8,470,684 B2
(45) Date of Patent: Jun. 25, 2013

(54) SUPPRESSION OF DIFFUSION IN EPITAXIAL BURIED PLATE FOR DEEP TRENCHES

(75) Inventors: Chengwen Pei, Danbury, CT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 13/106,349

(22) Filed: May 12, 2011

(65) Prior Publication Data

US 2012/0286392 A1 Nov. 15, 2012

(51) Int. Cl.
*H01L 21/20* (2006.01)
(52) U.S. Cl.
USPC .......................................... 438/391
(58) Field of Classification Search
USPC .................................. 438/386, 391
See application file for complete search history.

(56) References Cited

U.S. PATENT DOCUMENTS

| | | | |
|---|---|---|---|
| 6,133,610 A | 10/2000 | Bolam et al. | |
| 6,271,142 B1 | 8/2001 | Gruening et al. | |
| 6,440,794 B1 | 8/2002 | Kim | |
| 6,667,226 B2 | 12/2003 | Pinto et al. | |
| 6,838,724 B2 | 1/2005 | Kowalski et al. | |
| 6,885,080 B2 | 4/2005 | Chen et al. | |
| 6,963,113 B2 | 11/2005 | Ang et al. | |
| 7,439,603 B2 | 10/2008 | Jung et al. | |
| 2011/0193193 A1* | 8/2011 | Dube et al. | 257/532 |

OTHER PUBLICATIONS

U.S. Appl. No. 12/630,091, "An Integrated Circuit and a Method Using Integrated Process Steps to Form Deep Trench Isolation Structures and Deep Trench Capacitor Structures for the Integrated Circuit" filed Dec. 3, 2009, Anderson et al.
"Simultaneously Forming Deep Trench Isolation and Deep Trench Capacitor on the Same Chip" IPCOM000198808D, IP.com Electronic Publication: Aug. 17, 2010.
U.S. Appl. No. 12/704,084, "Structure and Method for Forming Isolation and Buried Plate for Trench Capacitor" filed Feb. 11, 2010, Wang et al.

* cited by examiner

*Primary Examiner* — Bradley K Smith
(74) *Attorney, Agent, or Firm* — Scully, Scott, Murphy & Presser, P.C.; Joseph P. Abate, Esq.

(57) ABSTRACT

Dopants of a first conductivity type are implanted into a top portion of a semiconductor substrate having a doping of the first conductivity type to increase the dopant concentration in the top portion, which is a first-conductivity-type semiconductor layer. A semiconductor material layer having a doping of the second conductivity type, a buried insulator layer, and a top semiconductor layer are formed thereupon. Deep trenches having a narrow width have a bottom surface within the second-conductivity-type semiconductor layer, which functions as a buried plate. Deep trenches having a wider width are etched into the first-conductivity-type layer underneath, and can be used to form an isolation structure. The additional dopants in the first-conductivity-type semiconductor layer provide a counterdoping against downward diffusion of dopants of the second conductivity type to enhance electrical isolation.

20 Claims, 11 Drawing Sheets

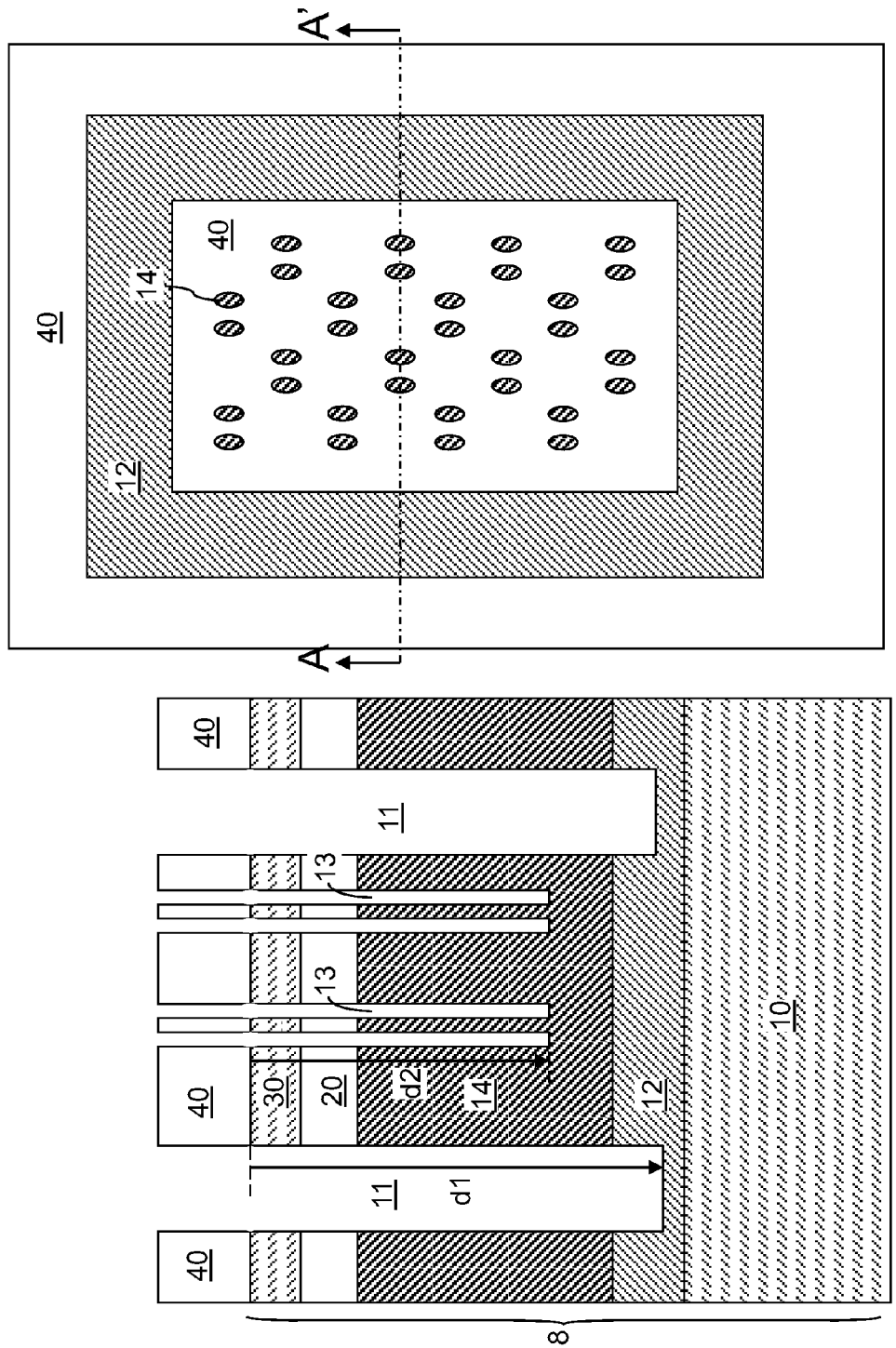

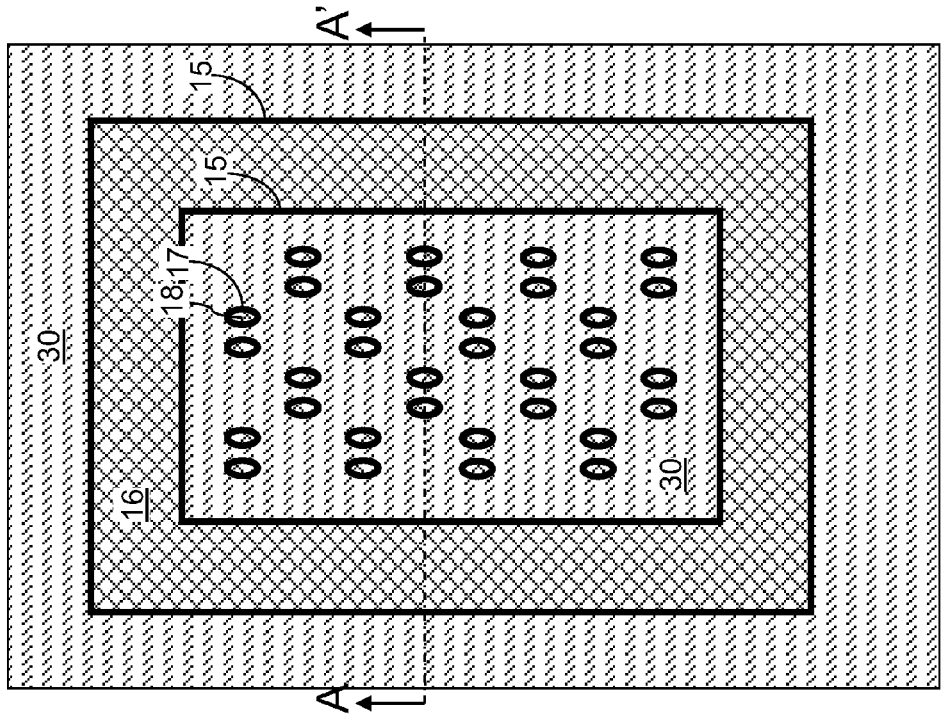
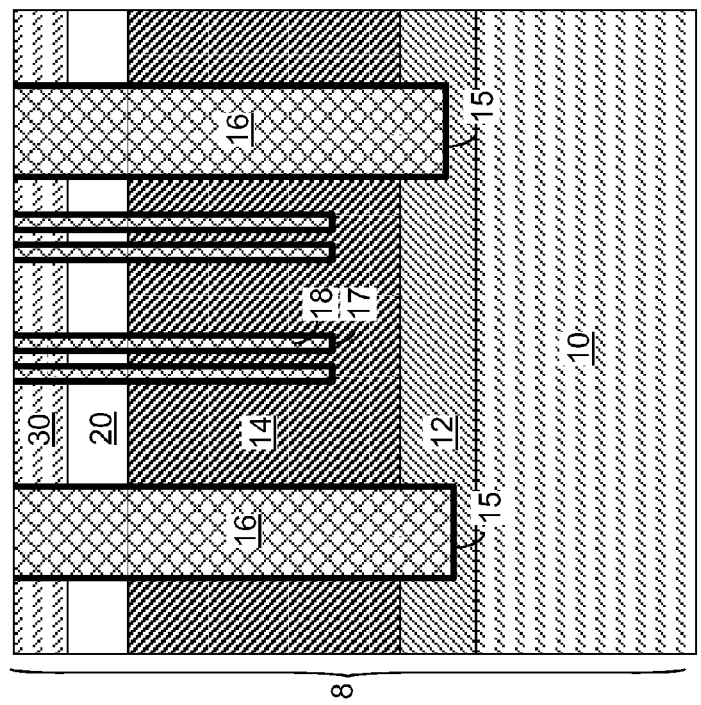
FIG. 10A
FIG. 10B

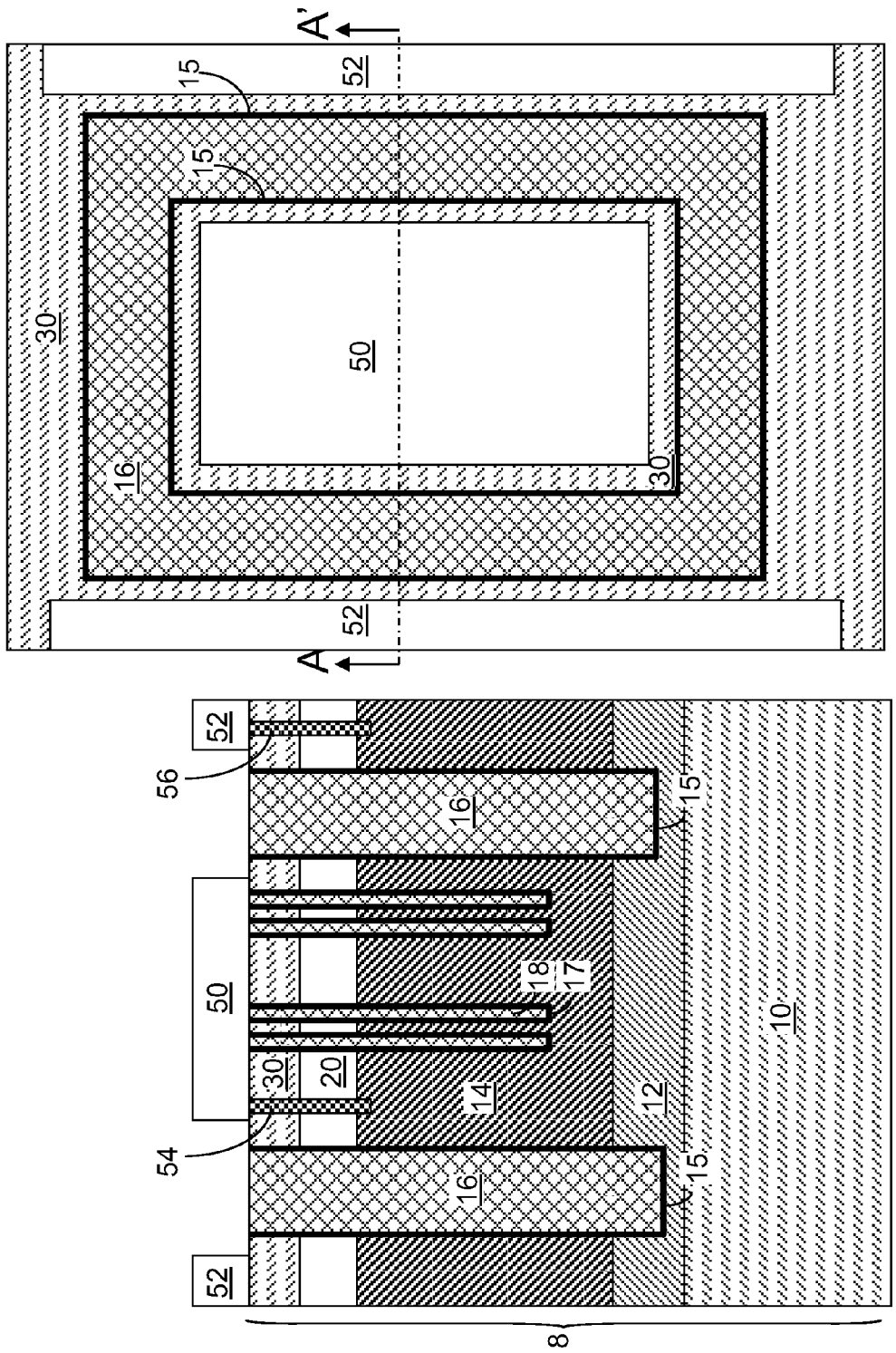

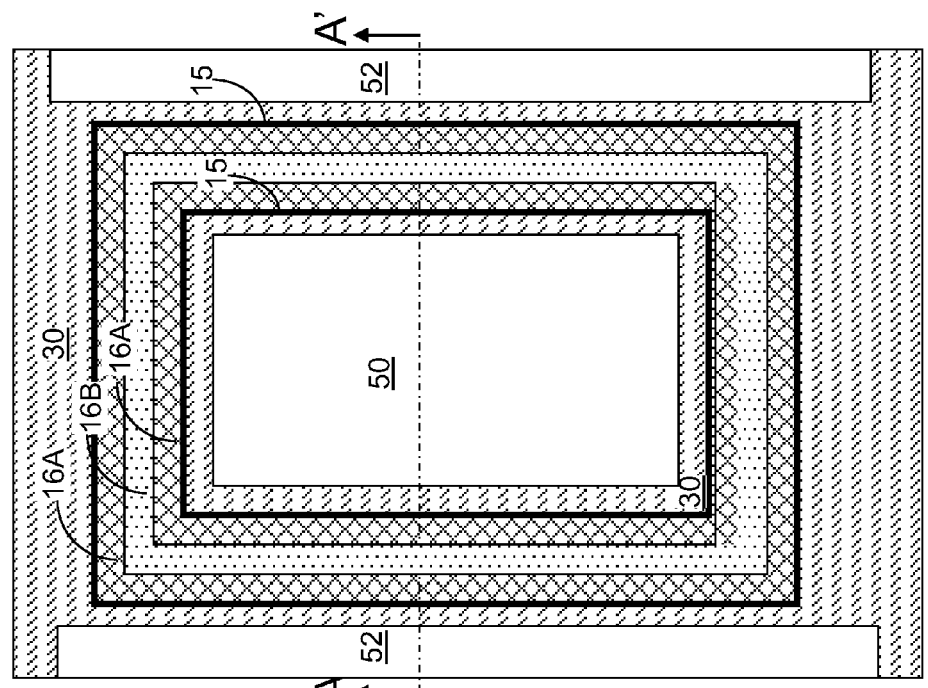
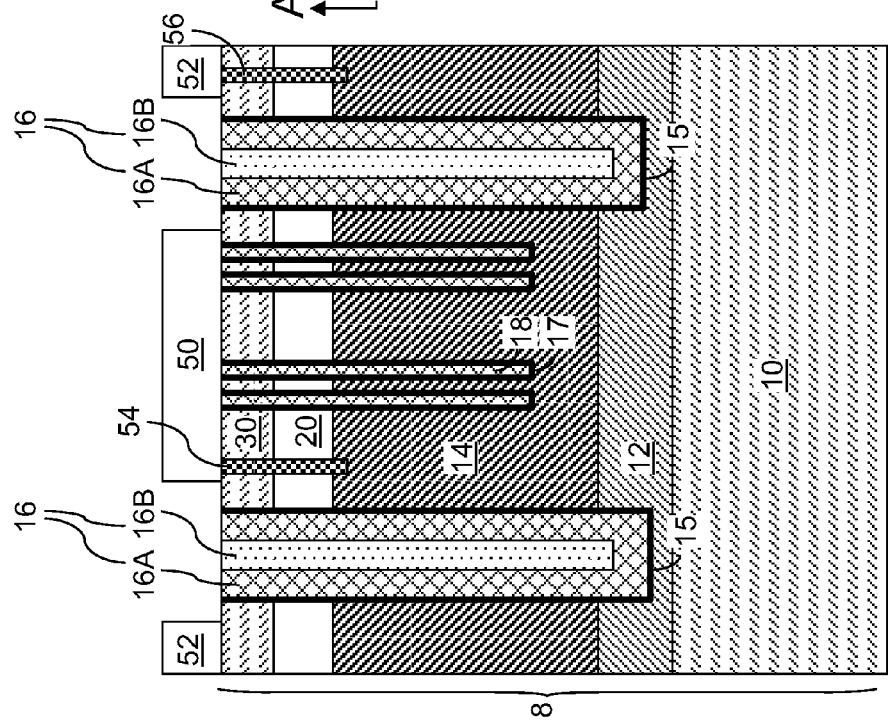
FIG. 13B
FIG. 13A

SUPPRESSION OF DIFFUSION IN EPITAXIAL BURIED PLATE FOR DEEP TRENCHES

BACKGROUND

The present disclosure relates to a semiconductor structure, and particularly to a semiconductor structure including a deep isolation trench and a buried plate around a deep capacitor trench and a method of manufacturing the same.

Deep trench capacitors are used in a variety of semiconductor chips for high areal capacitance and low device leakage. Typically, a deep trench capacitor provides a capacitance in the range from 4 fF (femto-Farad) to 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Deep trench capacitors are formed in a semiconductor substrate, which can be a semiconductor-on-insulator (SOI) substrate or a bulk substrate. Other semiconductor devices such as field effect transistors can be formed on the same semiconductor substrate, thereby enabling embedding of deep trench capacitors into a semiconductor chip. Such embedded deep trench capacitors enable various functionality including embedded dynamic access memory (eDRAM) and other embedded electronic components requiring a capacitor.

Deep trench capacitors can be concurrently formed in conjunction with deep isolation trenches. Deep isolation trenches can be patterned to have a greater width so that the deep isolation trenches extend to a greater depth than the depth of buried plates for deep trench capacitors. However, downward and lateral dopant diffusion from the buried plates of deep trench capacitors into an underlying semiconductor substrate can provide a leakage current path around the bottom surface of deep isolation trenches. To counter the effect of such vertical dopant diffusion from buried plates, the depth differential between the depth of deep isolation trenches and the depth of deep trenches for deep trench capacitors need to be increased. Such an increase in the depth differential requires wider deep isolation trenches, i.e., a greater width for deep trench moat structures filling the deep isolation trenches, and accompanying increase in the areal footprint for the deep isolation trenches.

BRIEF SUMMARY

Dopants of a first conductivity type are implanted into a top portion of a semiconductor substrate having a doping of the first conductivity type to increase the dopant concentration in the top portion, which is a first-conductivity-type semiconductor layer. A semiconductor material having a doping of a second conductivity type, which is the opposite of the first conductivity type, is deposited on the top portion to form a semiconductor material layer having a doping of the second conductivity type. A top semiconductor layer is bonded to the second-conductivity-type semiconductor layer with a buried oxide layer therebetween to form a semiconductor-on-insulator layer. Deep trenches having different widths are formed through the top semiconductor layer, the buried insulator layer, and the second-conductivity-type semiconductor layer. Deep trenches having a narrow width have a bottom surface within the second-conductivity-type semiconductor layer, which functions as a buried plate. Deep trenches having a wider width are etched through the second-conductivity-type semiconductor layer and into the first-conductivity-type layer underneath, and can be used to form an isolation structure. The additional dopants in the first-conductivity-type semiconductor layer provide a counterdoping against downward diffusion of dopants of the second conductivity type so that electrical isolation between each buried plate within an isolation structure and another buried plate outside the isolation structure is enhanced.

According to an aspect of the present disclosure, a semiconductor structure includes a semiconductor substrate including a vertical stack; at least one deep trench capacitor; and a deep isolation trench. The vertical stack includes, from bottom to top, at least a semiconductor substrate layer having a doping of a first conductivity type at a first dopant concentration at a lower portion thereof, a first-conductivity-type semiconductor layer having dopants of the first conductivity type at a second dopant concentration greater than the first dopant concentration, a second-conductivity-type semiconductor layer having a doping of a second conductivity type that is the opposite of the first conductivity type. Each of the at least one deep trench capacitor includes a node dielectric, an inner electrode, and a portion of the second-conductivity-type semiconductor layer. The node dielectric is vertically spaced from the first-conductivity-type semiconductor layer. The deep isolation trench vertically extends through the second-conductivity-type semiconductor layer and at least partly into the first-conductivity-type semiconductor layer.

According to another aspect of the present disclosure, a method of forming a semiconductor structure includes: forming a vertical stack, from bottom to top, of at least a semiconductor substrate layer having a doping of a first conductivity type at a first dopant concentration at a lower portion thereof, a first-conductivity-type semiconductor layer having dopants of the first conductivity type at a second dopant concentration greater than the first dopant concentration, a second-conductivity-type semiconductor layer having a doping of a second conductivity type that is the opposite of the first conductivity type; forming at least one deep trench capacitor within the vertical stack, wherein each of the at least one deep trench capacitor includes a node dielectric, an inner electrode, and a portion of the second-conductivity-type semiconductor layer, and the node dielectric is vertically spaced from the first-conductivity-type semiconductor layer; and forming a deep isolation trench vertically extending through the second-conductivity-type semiconductor layer and at least partly into the first-conductivity-type semiconductor layer.

BRIEF DESCRIPTION OF THE SEVERAL VIEWS OF THE DRAWINGS

FIG. 9A is a vertical cross-sectional view of the first exemplary semiconductor structure after formation of deep capacitor trenches and a deep isolation trench according to the first embodiment of the present disclosure.

FIG. 9B is a top-down view of the first exemplary semiconductor structure of FIG. 9A according to the first embodiment of the present disclosure. The A-A' plane in FIG. 9B is the plane of the vertical cross-sectional view of FIG. 9A.

FIG. 10A is a vertical cross-sectional view of the first exemplary semiconductor structure after formation of deep trench capacitors and a deep isolation trench structure according to the first embodiment of the present disclosure.

FIG. 10B is a top-down view of the first exemplary semiconductor structure of FIG. 10A according to the first embodiment of the present disclosure. The A-A' plane in FIG. 10B is the plane of the vertical cross-sectional view of FIG. 10A.

FIG. 11A is a vertical cross-sectional view of the first exemplary semiconductor structure after formation of buried contact via structures and semiconductor devices according to the first embodiment of the present disclosure.

FIG. 11B is a top-down view of the first exemplary semiconductor structure of FIG. 11A according to the first embodiment of the present disclosure. The A-A' plane in FIG. 11B is the plane of the vertical cross-sectional view of FIG. 11A.

FIG. 13A is a vertical cross-sectional view of a second exemplary semiconductor structure according to the second embodiment of the present disclosure.

FIG. 13B is a top-down view of the second exemplary semiconductor structure of FIG. 13A according to the second embodiment of the present disclosure. The A-A' plane in FIG. 13B is the plane of the vertical cross-sectional view of FIG. 13A.

DETAILED DESCRIPTION

Figure 1:
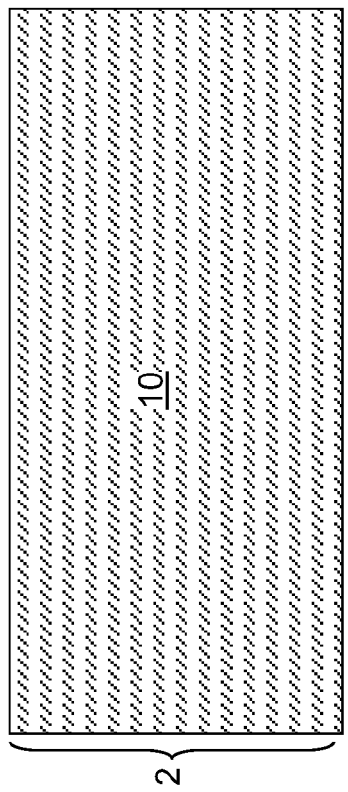
FIG. 1 is a vertical cross-sectional view of a first exemplary semiconductor structure including a first substrate having a semiconductor substrate layer according to a first embodiment of the present disclosure.

As stated above, the present disclosure relates to semiconductor structure including an isolation trench and a buried plate around a deep trench and a method of manufacturing the same, which are now described in detail with accompanying figures. It is noted that like reference numerals refer to like elements across different embodiments. The drawings are not necessarily drawn to scale.

As used herein, a "deep trench" refers to a trench that extends from a topmost surface of a semiconductor-on-insulator (SOI) substrate through a top semiconductor layer and a buried insulator layer and partly into an underlying semiconductor layer or a trench having a depth than the bottommost surface of shallow trench isolation structures in a bulk substrate. A "deep isolation trench" refers to a deep trench that electrically isolates two device components. A "deep capacitor trench" refers to a deep trench on which a capacitor is formed.

Referring to FIG. 1, a first exemplary semiconductor structure according to a first embodiment of the present disclosure includes a first substrate 2. The first substrate 2 can be a bulk substrate including a semiconductor substrate layer 10. The semiconductor substrate layer 10 includes a semiconductor material, which can be an elemental semiconductor material such as silicon or germanium, an alloy of elemental semiconductor materials such as a silicon carbon alloy or a silicon germanium alloy, a compound semiconductor material such as a III-V compound semiconductor material or a II-VI compound semiconductor material, or a combination thereof. The semiconductor substrate layer 10 can include a single crystalline semiconductor material in which the semiconductor material is aligned in a single crystalline lattice structure. For example, the semiconductor substrate layer 10 can be a single crystalline silicon layer. The thickness of the first substrate 2 can be from 50 microns to 1 mm, and typically from 600 microns to 900 microns, although lesser and greater thicknesses can also be employed.

The semiconductor substrate layer 10 can have a doping at a relatively low dopant concentration, which is herein referred to as a first dopant concentration. The first dopant concentration can be, for example, from $1.0 \times 10^{13}/cm^3$ to $1.0 \times 10^{17}/cm^3$, and typically from $1.0 \times 10^{14}/cm^3$ to $1.0 \times 10^{16}/cm^3$, although lesser and greater dopant concentrations can also be employed. The conductivity type of the semiconductor substrate layer 10 is herein referred to as a first conductivity type, which can be p-type or n-type. In one embodiment, the entirety of the semiconductor substrate layer 10 can have a uniform dopant concentration, which is the first dopant concentration.

Figure 2:
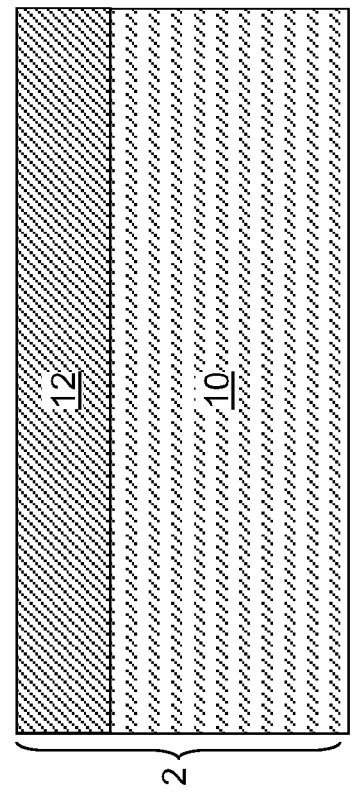
FIG. 2 is a vertical cross-sectional view of the first exemplary semiconductor structure after conversion of an upper portion of the semiconductor substrate layer into a first-conductivity-type semiconductor layer according to the first embodiment of the present disclosure.

Referring to FIG. 2, a first-conductivity-type semiconductor layer 12 is formed on the semiconductor substrate layer 10. In one embodiment, the first-conductivity-type semiconductor layer 12 can be formed by adding additional dopants of the first conductivity type to an upper portion of the semiconductor substrate layer 10.

Ion implantation, gas phase doping, and/or outdiffusion of dopants from a disposable doped dielectric material can be employed. If ion implantation is employed, the depth of ion implantation can be from 0.3 microns to 2.0 microns, and typically from 0.6 microns to 1.2 microns, although lesser and greater thicknesses can also be employed. If ion implantation is employed and the first conductivity type is p-type, p-type dopants such as B, Ga, and/or In are implanted into the upper portion of the semiconductor substrate layer 10. If ion implantation is employed and the first conductivity type is n-type, n-type dopants such as P, As, and/or Sb are implanted into the upper portion of the semiconductor substrate layer 10. If a disposable doped dielectric material is employed and the first conductivity type is p-type, borosilicate glass (BSG) can be employed to drive in p-type dopants (boron) into the upper portion of the semiconductor substrate layer 10. If a disposable doped dielectric material is employed and the first conductivity type is n-type, arsenosilicate glass (ASG) or phosphosilicate glass (PSG) can be employed to drive in n-type dopants into the upper portion of the semiconductor substrate layer 10.

The upper portion of the semiconductor substrate layer 10 that is added with additional dopants of the first conductivity type is thus converted into the first-conductivity-type semiconductor layer 12, which has a greater dopant concentration than the remaining portion of the semiconductor substrate layer 10. The concentration of the first conductivity type dopants in the first-conductivity-type semiconductor layer 12 is herein referred to as a second dopant concentration. The second dopant concentration is greater than the first dopant concentration, and can be from $1.0 \times 10^{15}/cm^3$ to $1.0 \times 10^{20}/cm^3$, and typically from $1.0 \times 10^{16}/cm^3$ to $1.0 \times 10^{19}/cm^3$, although lesser and greater dopant concentrations can also be employed. In one embodiment, the second dopant concentration is greater than the first dopant concentration by an order of magnitude.

Due to dopant diffusion that occurs in the first substrate 2 during concurrent or subsequent thermal processing, the dopant concentration profile along the vertical direction in the first substrate has the second dopant concentration in the first-conductivity-type semiconductor layer 12, a "retrograde profile," which is a dopant concentration profile that decreases with increasing depth from the top surface of a substrate. Thus, the dopant concentration of the first conductivity type dopants gradually decreases from the second dopant concentration to the first dopant concentration in an upper portion of the semiconductor substrate layer 10 directly underneath the first-conductivity-type semiconductor layer 12, and the first dopant concentration in a lower portion of the semiconductor substrate layer 10 that is not affected by the downward diffusion of the first conductivity type dopants into the semiconductor substrate layer 10.

In another embodiment, the first-conductivity-type semiconductor layer 12 can be formed on the topmost surface of the semiconductor substrate layer 10 by deposition of a semiconductor material having a doping of the first conductivity type at a greater dopant concentration than the first dopant concentration. In this embodiment, the doped semiconductor material of the first-conductivity-type semiconductor layer 12 is added to the semiconductor substrate layer 10, for example, by epitaxy employing in-situ doping. The dopant concentration of the first conductivity type dopants in the first-conductivity-type semiconductor layer 12 is referred to as a second dopant concentration. The second dopant concentration is greater than the first dopant concentration, and can be from $1.0 \times 10^{15}/cm^3$ to $1.0 \times 10^{20}/cm^3$, and typically from $1.0 \times 10^{16}/cm^3$ to $1.0 \times 10^{19}/cm^3$, although lesser and greater dopant concentrations can also be employed. In one embodiment, the second dopant concentration is greater than the first dopant concentration by an order of magnitude.

Figure 3:
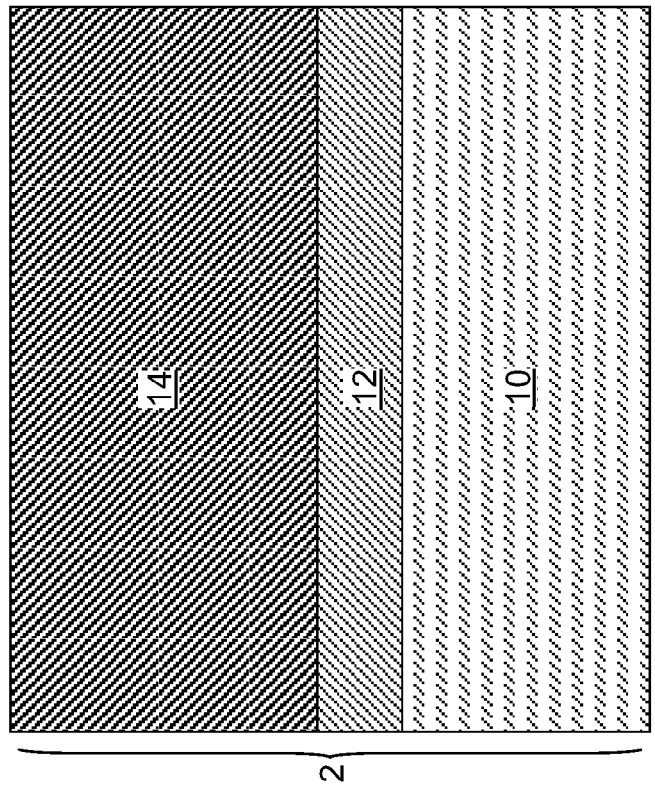
FIG. 3 is a vertical cross-sectional view of a first exemplary semiconductor structure after deposition of a second-conductivity-type semiconductor layer according to the first embodiment of the present disclosure.

Referring to FIG. 3, a second-conductivity-type semiconductor layer 14 is formed directly on the top surface of the first-conductivity-type semiconductor layer 12. The second-conductivity-type semiconductor layer 14 has a doping of a second conductivity type, which is the opposite of the first conductivity type. For example, if the first conductivity type is p-type, the second conductivity type is n-type, and vice versa. Thus, a vertical stack is formed, which includes, from bottom to top, a semiconductor substrate layer 10 having a doping of the first conductivity type at the first dopant concentration at a lower portion thereof, the first-conductivity-type semiconductor layer 12 having dopants of the first conductivity type at the second dopant concentration greater than the first dopant concentration, and the second-conductivity-type semiconductor layer 14 having a doping of the second conductivity type.

In one embodiment, the second-conductivity-type semiconductor layer 14 can have a doping of the second conductivity type at a third dopant concentration that is the same throughout the entirety of the second-conductivity-type semiconductor layer 14. In this embodiment, the dopant concentration of the second conductivity type dopants in the second-conductivity-type semiconductor layer 14 is referred to as a third dopant concentration. The third dopant concentration can be from $1.0 \times 10^{15}/cm^3$ to $1.0 \times 10^{21}/cm^3$, and typically from $1.0 \times 10^{17}/cm^3$ to $1.0 \times 10^{20}/cm^3$, although lesser and greater third dopant concentrations can also be employed. In one embodiment, the third dopant concentration can be greater than the second dopant concentration.

In one embodiment, the second-conductivity-type semiconductor layer 14 can be a layer of a single crystalline semiconductor material that is epitaxially aligned to a single crystalline semiconductor material of the first-conductivity-type semiconductor material. For example, the first-conductivity-type semiconductor material can be p-doped single crystalline silicon, and the second-conductivity-type semiconductor material can be n-doped single crystalline silicon, or vice versa. If the second-conductivity-type semiconductor material is a single crystalline semiconductor material, the second-conductivity-type semiconductor layer 14 can be formed by epitaxy. Specifically, the second-conductivity-type semiconductor layer 14 can be epitaxially grown on the top surface of the first-conductivity-type semiconductor layer 12 employing in-situ doping, in which a precursor for a semiconductor material (such as $SiH_4$, $Si_2H_6$, $SiH_2Cl_2$, $SiHCl_3$, $SiCl_4$, $GeH_4$, or $Ge_2H_6$) and a dopant gas (such as $PH_3$, $AsH_3$, $SbH_3$, or $B_2H_6$) are concurrently flowed into a reactor including the first substrate 2. The thickness of the second-conductivity-type semiconductor layer 14 can be from 2 microns to 10 microns, and typically from 4 microns to 6 microns, although lesser and greater thicknesses can also be employed.

Figure 4:
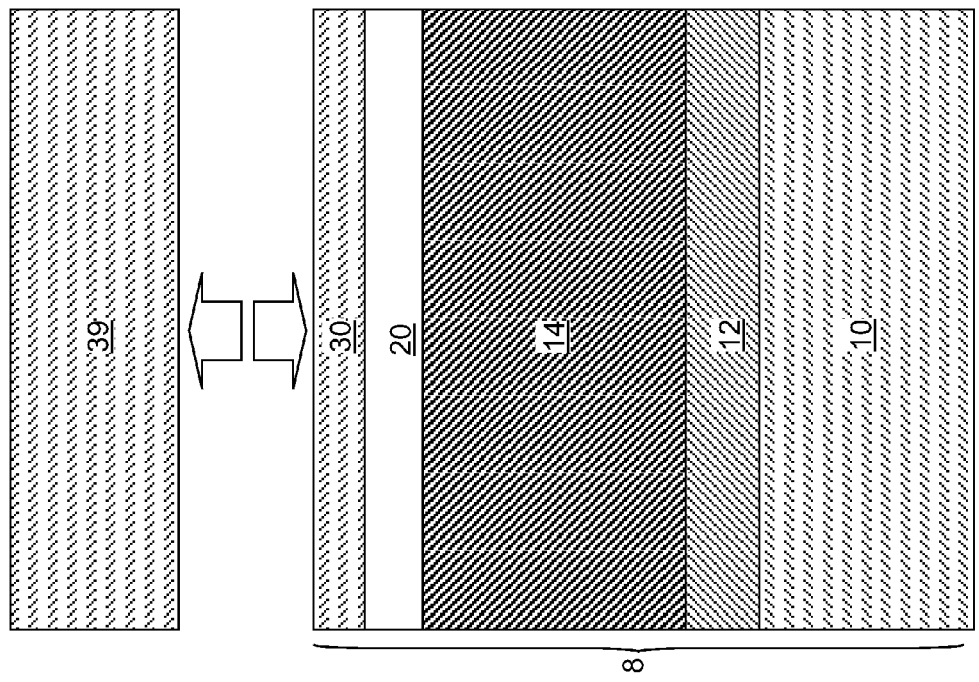
FIG. 4 is a vertical cross-sectional view of the first exemplary semiconductor structure prior to bonding a second substrate including an insulator layer and a semiconductor material layer with the first substrate according to the first embodiment of the present disclosure.

Referring to FIG. 4, a second substrate 4 is provided. The second substrate 4 includes an insulator layer 20P and a semiconductor material layer 30P and a handle substrate 39. For example, the second substrate 4 can include a stack, from bottom to top, of the insulator layer 20, the semiconductor material layer 30P, a hydrogen layer 31, and the handle substrate 39. The stack of the semiconductor material layer 30P, the hydrogen layer 31, and the handle substrate 39 can be formed, for example, by providing a single crystalline semiconductor substrate and implanting hydrogen atoms to a constant depth in the single crystalline semiconductor substrate. The implanted hydrogen atoms form the hydrogen layer 31, which can have a thickness of about one atomic layer. An exposed surface portion of the single crystalline semiconductor substrate can be converted, for example, by thermal oxidation, into the insulator layer 20P before, or after, the formation of the hydrogen layer 31 by hydrogen implantation.

The thickness of the semiconductor material layer 30P can be from 10 nm to 200 nm, and typically from 20 nm to 100 nm, although lesser and greater thicknesses can also be employed. The semiconductor material layer 30P can include a single crystalline semiconductor material, which can be single crystalline silicon, single crystalline germanium, a single crystalline alloy of elemental semiconductor materials, a single crystalline compound semiconductor material, or a stack thereof. Alternately, the semiconductor material layer 30P can include a polycrystalline semiconductor material or an amorphous semiconductor material instead of a single crystalline semiconductor material.

The thickness of the insulator layer 20P can be from 20 nm to 400 nm, and typically from 50 nm to 200 nm, although lesser and greater thicknesses can also be employed. The insulator layer 20P can be derived from a semiconductor material, for example, by thermal or plasma conversion of a surface portion of a single crystalline semiconductor substrate. Thus, the insulator layer 20P can include a dielectric oxide, a dielectric nitride, or a dielectric oxynitride of the semiconductor material of the single crystalline semiconductor substrate. Alternately, a polycrystalline semiconductor substrate or an amorphous semiconductor substrate can be employed in lieu of a single crystalline semiconductor substrate provided a cleavage layer such as a hydrogen layer 31 is provided therein.

The first substrate 2 and the second substrate 4 are brought toward each other so that an exposed surface of the second-conductivity-type semiconductor layer 14 in the first substrate 2 faces an exposed surface of the insulator layer 20P in the second substrate 4.

Figure 5:
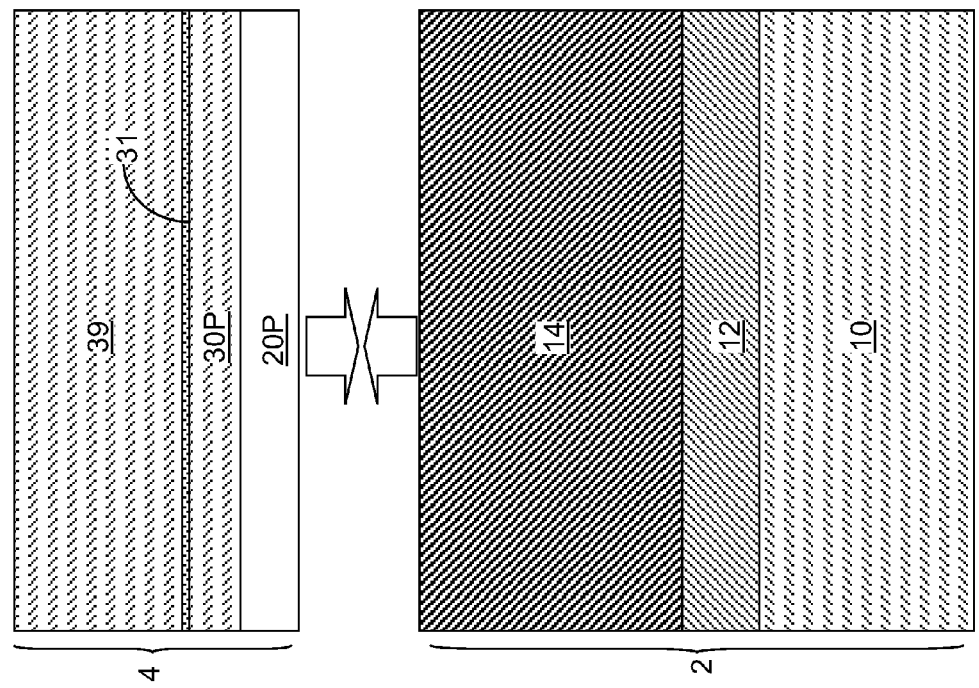
FIG. 5 is a vertical cross-sectional view of the first exemplary semiconductor structure after the insulator layer and the semiconductor material layer are bonded to the first substrate according to the first embodiment of the present disclosure.

Referring to FIG. 5, the first substrate 2 and the second substrate 4 are subjected to a bonding process while a surface of the insulator layer 20P contacts a surface of the second-conductivity-type semiconductor layer 14. The bonding process can be a thermal anneal at an elevated temperature, which can be from 120 degrees Celsius to 400 degree Celsius. The second substrate 4 can also be cleaved at the hydrogen layer 31 so that the handle substrate 39 is dissociated from the semiconductor material layer 30P. A semiconductor substrate 8, which is a bonded substrate, is formed. The insulator layer 20P as incorporated into the semiconductor substrate 8 is herein referred to as a buried insulator layer 20, and the semiconductor material layer 30P as incorporated into the semiconductor substrate 8 is herein referred to as a top semiconductor layer 30. Thus, the vertical stack in the semiconductor substrate 8 includes, from bottom to top, of the semiconductor substrate layer 10, the first-conductivity-type semiconductor layer 12, the second-conductivity-type semiconductor layer 14, the buried insulator layer 20, and the top semiconductor layer 30.

Figure 6:
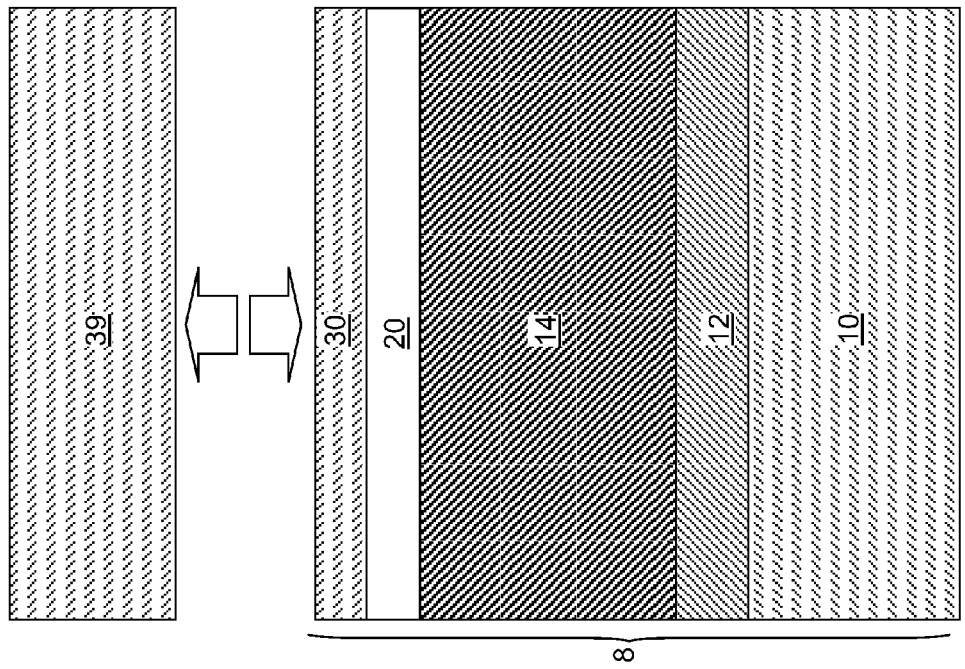
FIG. 6 is a vertical cross-sectional view of a variation of the first exemplary semiconductor structure prior to bonding a second substrate including a semiconductor material layer with an insulator layer on the first substrate according to the first embodiment of the present disclosure.

Referring to FIG. 6, a variation of the first exemplary semiconductor structure according to the first embodiment of the present disclosure is illustrated. The variation of the first exemplary semiconductor structure includes a first substrate 2' and a second substrate 4'. The first substrate 2' can be derived from the first substrate 2 in FIG. 3 by forming an insulator layer 20Q thereupon.

Specifically, an exposed surface portion of the second-conductivity-type semiconductor layer 14 can be converted, for example, by thermal oxidation, into the insulator layer 20Q. The thickness of the insulator layer 20Q can be from 20 nm to 400 nm, and typically from 50 nm to 200 nm, although lesser and greater thicknesses can also be employed. The insulator layer 20Q can be derived from a semiconductor material, for example, by thermal or plasma conversion of a surface portion of the second-conductivity-type semiconductor layer 14. Thus, the insulator layer 20Q can include a dielectric oxide, a dielectric nitride, or a dielectric oxynitride of the semiconductor material of the second-conductivity-type semiconductor layer 14. For example, if the second-conductivity-type semiconductor layer 14 includes doped silicon, the insulator layer 20Q can include silicon oxide, silicon nitride, silicon oxynitride, or a combination thereof.

Further, a second substrate 4' is provided. The second substrate 4' includes a semiconductor material layer 30Q and a handle substrate 39. For example, the second substrate 4' can include a stack, from bottom to top, of the semiconductor material layer 30Q, a hydrogen layer 31, and the handle substrate 39. The stack of the semiconductor material layer 30Q, the hydrogen layer 31, and the handle substrate 39 can be formed, for example, by providing a single crystalline semiconductor substrate and implanting hydrogen atoms to a constant depth in the single crystalline semiconductor substrate. The implanted hydrogen atoms form the hydrogen layer 31, which can have a thickness of about one atomic layer.

The thickness of the semiconductor material layer 30Q can be from 10 nm to 200 nm, and typically from 20 nm to 100 nm, although lesser and greater thicknesses can also be employed. The semiconductor material layer 30Q can include a single crystalline semiconductor material, which can be single crystalline silicon, single crystalline germanium, a single crystalline alloy of elemental semiconductor materials, a single crystalline compound semiconductor material, or a stack thereof. Alternately, the semiconductor material layer 30Q can include a polycrystalline semiconductor material or an amorphous semiconductor material instead of a single crystalline semiconductor material.

Figure 7:
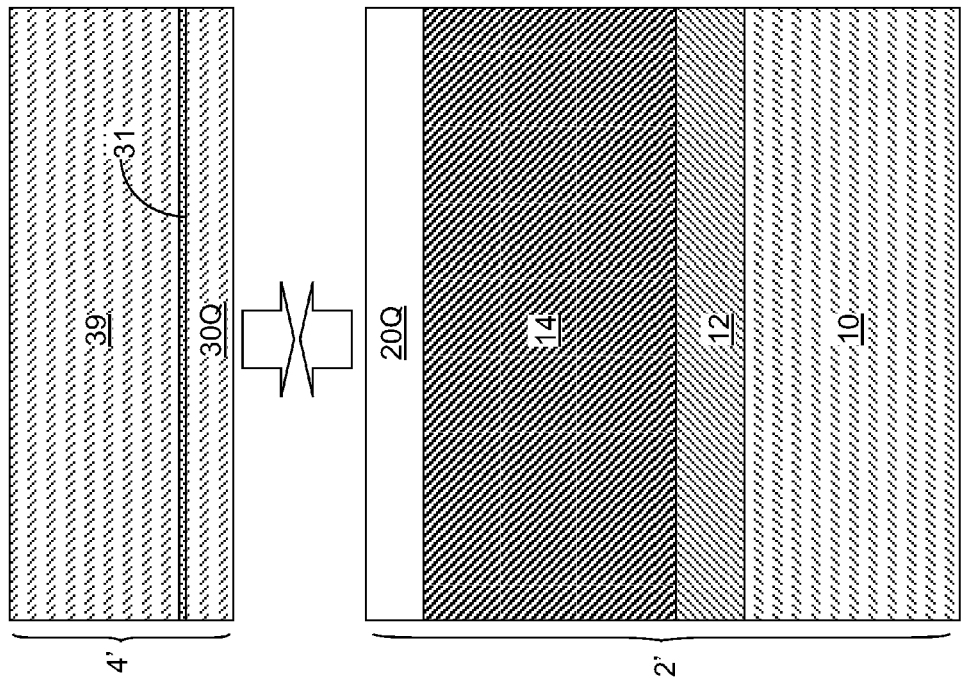
FIG. 7 is a vertical cross-sectional view of the variation of the first exemplary semiconductor structure after the semiconductor material layer is bonded to the first substrate according to the first embodiment of the present disclosure.

Referring to FIG. 7, the variation of the first exemplary semiconductor structure is further processed to form a semiconductor substrate 8, which is a bonded substrate. Specifically, the first substrate 2' and the second substrate 4' are subjected to a bonding process while a surface of the insulator layer 20Q contacts a surface of the semiconductor material layer 30Q. The bonding process can be a thermal anneal at an elevated temperature, which can be from 120 degrees Celsius to 400 degree Celsius. The second substrate 4' can also be cleaved at the hydrogen layer 31 so that the handle substrate 39 is dissociated from the semiconductor material layer 30Q. The insulator layer 20Q as incorporated into the semiconductor substrate 8 is herein referred to as a buried insulator layer 20, and the semiconductor material layer 30Q as incorporated into the semiconductor substrate 8 is herein referred to as a top semiconductor layer 30. Thus, the vertical stack in the semiconductor substrate 8 includes, from bottom to top, of the semiconductor substrate layer 10, the first-conductivity-type semiconductor layer 12, the second-conductivity-type semiconductor layer 14, the buried insulator layer 20, and the top semiconductor layer 30. The semiconductor substrate 8 of the variation of the first exemplary semiconductor structure in FIG. 7 can have the same structure as the semiconductor substrate 8 of the first exemplary semiconductor structure in FIG. 5.

Figures 8A, 8B:
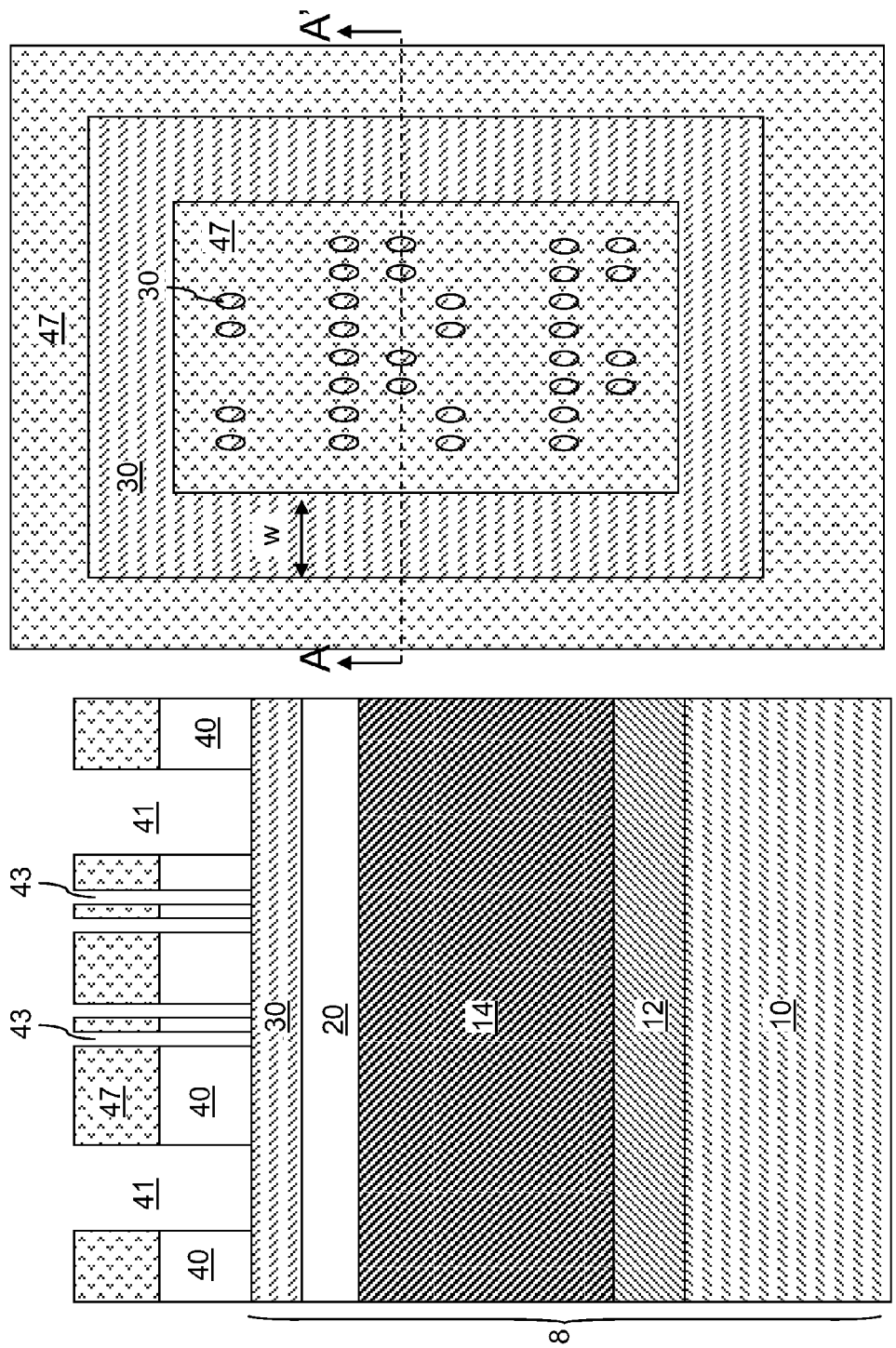
FIG. 8A is a vertical cross-sectional view of the first exemplary semiconductor structure after a hard mask layer is patterned by a combination of lithographic methods and an anisotropic etch according to the first embodiment of the present disclosure.
FIG. 8B is a top-down view of the first exemplary semiconductor structure of FIG. 8A according to the first embodiment of the present disclosure. The A-A' plane in FIG. 8B is the plane of the vertical cross-sectional view of FIG. 8A.

Referring to FIGS. 8A and 8B, a hard mask layer 40 is deposited on the top surface of the top semiconductor layer 30 of the semiconductor substrate 8 as provided in FIG. 5 or FIG. 7. The hard mask layer 40 includes a dielectric material such as borosilicate glass (BSG), undoped silicate glass (USG), silicon nitride, or a stack thereof. The thickness of the hard mask layer 40 can be from 300 nm to 1,200 nm, although lesser or greater thicknesses can also be employed. The hard mask layer 40 can be deposited, for example, by chemical vapor deposition (CVD).

A photoresist 47 is applied over the hard mask layer 40, and is lithographically patterned by lithographic exposure and development. The thickness of the photoresist 47 can be from 400 nm to 800 nm, although lesser and greater thicknesses can also be employed. An antireflective coating (ARC) layer (not shown) can also be employed.

The photoresist 47 is patterned to form capacitor trench openings 43 and at least one moat opening 41. The trench capacitor openings 43 are formed in areas in which capacitor trenches are to be subsequently formed. Each of the at least one moat opening 41 is formed in an area in which a deep isolation trench is to be subsequently formed. In a top-down view, a moat opening 41 laterally surrounds and encloses a device area in which multiple capacitor trench openings 43 are present.

Each moat opening 41 can have a constant width or variable widths. The minimum width w of each moat opening 41 can be the constant width or the minimum of the variable widths. The minimum width w of each moat opening 41 is greater than the maximum lateral dimension of the capacitor trench openings 43. For example, if the capacitor trench openings 43 have shapes of an ellipse, the minimum width w of the moat openings 41 is greater than the major axis of the ellipse. In one embodiment, the minimum width w of the moat openings 41 is at least twice the maximum lateral dimension of the capacitor trench openings 43. In another embodiment, the minimum width w of the moat openings 41 is at least three times the maximum lateral dimension of the capacitor trench openings 43.

For example, each capacitor trench openings 43 can have a shape of an ellipse in which the major axis is from 100 nm to 300 nm and the minor axis is from 40 nm to 150 nm. In this case, a moat opening 41 can have a constant width throughout, and the constant width can be from 0.6 microns to 10 microns.

An anisotropic etch is performed to transfer the pattern in the photoresist 47 into the hard mask layer 40. Thus, each capacitor trench opening 43 extends from the topmost surface of the photoresist 47 to the top surface of the semiconductor substrate 8, i.e., to the top surface of the top semiconductor layer 30. Further, each moat opening 41 extends from the topmost surface of the photoresist 47 to the top surface of the semiconductor substrate 8. Thus, the hard mask layer 40 is patterned by a combination of lithographic methods and the anisotropic etch. The photoresist 47 can be subsequently removed, for example, by ashing.

Referring to FIGS. 9A and 9B, the pattern in the hard mask layer 40 is transferred into an upper portion of the semiconductor substrate 8 by an anisotropic etch that employs the hard mask layer 40 as an etch mask. Fluorocarbon-based etch chemistry may be employed to anisotropically etch the semiconductor material of the top semiconductor layer 30, the dielectric material of the buried insulator layer 20, and the semiconductor material of the second-conductivity-type semiconductor layer 14. Typically, an upper portion of the hard mask layer 40 is eroded during the anisotropic etch. The fluorocarbon based etch chemistry can employ an etchant such as $CF_4$, $CHF_3$, and/or $C_3F_8$.

Deep capacitor trenches 13 are formed underneath the capacitor trench openings 43 (See FIGS. 8A and 8B), and a deep isolation trench 11 is formed underneath each moat opening 41. Because the lateral dimensions of the deep capacitor trenches and the at least one deep isolation trench 11 are different, the anisotropic etch removes the materials of the semiconductor substrate 8 at different rates. Particularly, as the aspect ratio of the deep capacitor trenches 13 and the deep isolation trench 11 increases toward the end of the anisotropic etch, the etchant gas of the anisotropic etch process does not effectively reach the bottom surfaces of narrow trenches, i.e., the bottom surfaces the deep capacitor trenches 13, while the etchant is effectively supplied to the bottom of a wide trench, i.e., a deep isolation trench 11. Thus, etch rate of the semiconductor material of the second-conductivity-type semiconductor layer 14 is significantly reduced at the bottom of the deep capacitor trenches 13 relative to the bottom of the deep isolation trench 11 toward the end of the anisotropic etch process.

Thus, the inaccessibility to the bottom of the deep capacitor trenches 13 by the etchant gases during the anisotropic etch provides a depth differential between the deep capacitor trenches 13 and the deep isolation trench 11. The duration of the anisotropic etch can be selected so that the bottom surfaces of the deep capacitor trenches 13 are present within the second-conductivity-type semiconductor layer 14, i.e., above the horizontal interface between the first-conductivity-type semiconductor layer 12 and the second-conductivity-type semiconductor layer 14, and the bottom surface(s) of the at least one deep isolation trench 11 is/are present within the first-conductivity-type semiconductor layer 12, i.e., below the horizontal interface between the first-conductivity-type semiconductor layer 12 and the second-conductivity-type semiconductor layer 14, at the end of the anisotropic etch. Thus, the at least one deep isolation trench 11 has a first depth d1 that exceeds the sum of the thicknesses of the top semiconductor layer 30, the buried insulator 20, and the second-conductivity-type semiconductor layer 14 at the end of the anisotropic etch, while the deep capacitor trenches 13 has a second depth d2 that is less than the sum of the thicknesses of the top semiconductor layer 30, the buried insulator 20, and the second-conductivity-type semiconductor layer 14 at the end of the anisotropic etch. Therefore, each deep isolation trench 11 vertically extends through the second-conductivity-type semiconductor layer 14 and at least partly into the first-conductivity-type semiconductor layer 12.

Each deep isolation trench 11 can be formed in a pattern that laterally surrounds a portion of the second-conductivity-type semiconductor layer 14 that embeds the deep capacitor trenches 13. That portion of the second-conductivity-type semiconductor layer 14 is vertically contacted by the buried insulator layer 20 and the first-conductivity-type semiconductor layer 12, and is laterally bounded by the deep isolation trench 11.

Referring to FIGS. 10A and 10B, a conformal dielectric material layer is deposited, for example, by chemical vapor deposition (CVD) or atomic layer deposition (ALD). The conformal dielectric material layer includes a dielectric material, which can be silicon nitride, silicon oxide, silicon oxynitride, a dielectric metal oxide, or a combination thereof. The dielectric metal oxide is a high-k material having a dielectric constant greater than 8.0 and containing a metal and oxygen, and is known in the art as high-k gate dielectric materials. The conformal dielectric material layer can have a thickness from 2 nm to 6 nm, although lesser and greater thicknesses can also be employed. The conformal dielectric material layer lines all sidewalls and bottom surfaces of the deep capacitor trenches 13 and the at least one deep isolation trench 11.

A conductive material can be deposited in the deep capacitor trenches 13 and the at least one deep isolation trench 11 to completely fill the deep capacitor trenches 13 and the at least one deep isolation trench 11. The conductive material can be deposited, for example, by chemical vapor deposition (CVD). The conductive material can include a doped semiconductor material, a metallic material, or a combination thereof. The doped semiconductor materials that can be employed to fill the deep capacitor trenches 13 and the at least one deep isolation trench 11 include, but are not limited to, doped silicon, doped germanium, a doped silicon germanium alloy, a doped compound semiconductor material, and combinations thereof. The metallic material that can be employed to fill the deep capacitor trenches 13 and the at least one deep isolation trench 11 include, but are not limited to, TiN, TaN, WN, Ti, Ta, W, Al, Cu, and combinations thereof.

The excess conductive material that is deposited over the top surface of the hard mask layer 40 is removed, for example, by chemical mechanical planarization, a recess etch, or a combination thereof. Further, the conductive material above the top surface of the semiconductor substrate 8 is removed, for example, by a recess etch so that the top surfaces of the remaining portions of the conductive material are substantially coplanar with the exposed semiconductor surfaces of the top semiconductor layer 30. The hard mask layer 40 and the portions of the conformal dielectric material layer above the top surface of the semiconductor substrate 8 is removed, for example, by a wet etch that is selective to the semiconductor material of the top semiconductor layer 30 and the conductive material(s) that fill the deep capacitor trenches 13 and the at least one deep isolation trench 11. Thus, all material portions are removed from above the top surface of the top semiconductor layer 30.

The remaining portions of the conformal dielectric material layer within the deep capacitor trenches 13 constitute node dielectrics 17. The remaining portion of the conformal dielectric material layer within a deep isolation trench 11 constitutes a dielectric liner 15. The node dielectrics 17 and the at least one dielectric liner 15 have the same composition and the same thickness. Each node dielectric 17 contacts an entirety of sidewalls and a bottom surface of a deep capacitor trench 13. Each dielectric liner 15 contacts an entirety of sidewalls and a bottom surface of a deep isolation trench 11. As discussed above, the dielectric liner(s) 15 and the node dielectrics 17 are concurrently deposited in the deep isolation trench(es) 11 and the deep capacitor trenches 13, respectively, as the conformal dielectric material layer. Each node dielectric 17 does not contact, and is vertically spaced from, the first-conductivity-type semiconductor layer 12.

The remaining portions of the conductive material within the deep capacitor trenches 13 constitute inner electrodes 18. The remaining portion of the conductive material within each deep isolation trench 11 constitutes a conductive material portion, which is a deep isolation trench fill portion 16, i.e., a material portion that fills the deep isolation trench 11. The inner electrodes 18 and the at least one deep isolation trench fill portion 16 have the same composition. Each inner electrode 18 contacts inner sidewalls of a node dielectric 17. Each deep isolation trench fill portion 16 contacts inner sidewalls of a dielectric liner 15. As discussed above, the conductive material portion(s) 16 and the inner electrodes 18 are concurrently deposited in the deep isolation trench(es) 11 and the deep capacitor trenches 13, respectively, as the conductive material that completely fills the deep isolation trench(es) 11 and the deep capacitor trenches 13.

Deep trench capacitors are provided in the semiconductor substrate 8. Each deep trench capacitor includes a node dielectric 17 located within a deep capacitor trench 13, an inner electrode 18, and a portion of the second-conductivity-type semiconductor layer 14, which is a common outer electrode for all deep trench capacitors laterally surrounded by a deep isolation trench 11 (See FIGS. 9A and 9B). Each deep isolation trench 11 is filled with a dielectric liner 15 and a deep isolation trench fill portion 16. The dielectric liner 15 electrically isolates the deep isolation trench fill portion 16 from the semiconductor materials of the top semiconductor layer 30, the second-conductivity-type semiconductor layer 14, and the first-conductivity-type semiconductor layer 12.

Referring to FIGS. 11A and 11B, shallow trench isolation structures (not shown) can be formed between the top surface and the bottom surface of the top semiconductor layer 30. Buried contact via structures 54 can be formed through the top semiconductor layer 30 and the buried insulator layer 20 and to contact the second-conductivity-type semiconductor layer 14. The buried contact via structures 54 can be formed, for example, by forming trenches extending from the top surface of the top semiconductor layer 30 through the top semiconductor layer 30 and the buried insulator layer 20 to the second-conductivity-type semiconductor layer 14, and subsequently filling the trenches with a conductive material. Optionally, dielectric spacers (not shown) can be provided on the sidewalls of the buried contact via structures 54 to electrically isolate the buried contact via structures 54 from laterally surrounding semiconductor materials. The buried contact via structures 54 can provide electrical contact to various portions of the second-conductivity-type semiconductor layer 14 including the portions of the second-conductivity-type semiconductor layer 14 that function as an outer electrode of deep trench capacitors (17, 18, 14).

At least one semiconductor device (50, 52) can be formed on the top semiconductor layer. The at least one semiconductor device (50, 52) can include access transistors that electrically connects or disconnects the inner electrodes 18 of the deep trench capacitors (17, 18, 14). Further, the at least one semiconductor device (50, 52) can include transistors configured to control the electrical bias voltage applied to the portions of the second-conductivity-type semiconductor layer 14 that function as outer electrodes of deep trench capacitors (17, 18, 14) through the buried contact via structures 54.

Figure 12:
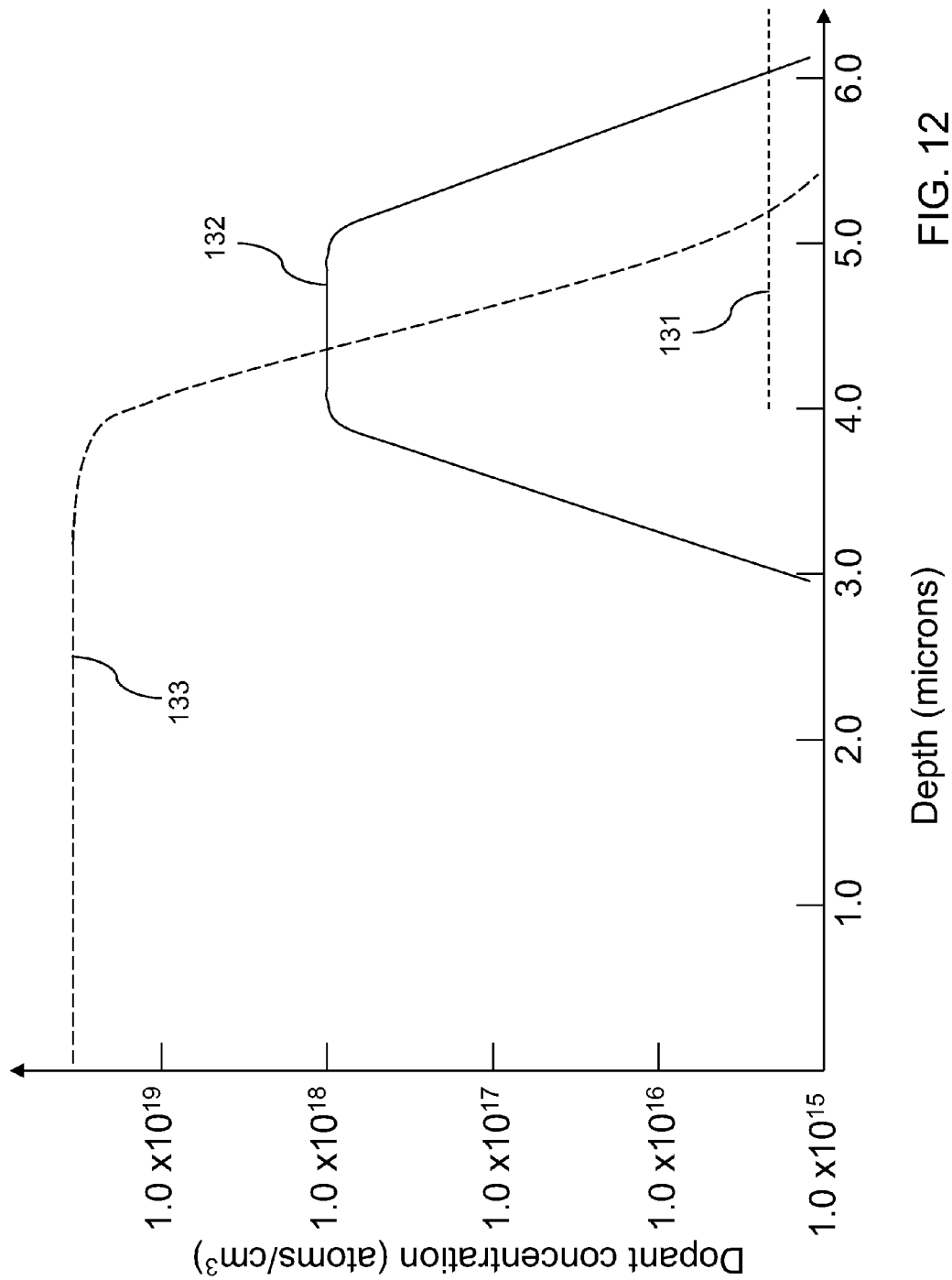
FIG. 12 is a vertical dopant concentration profile in the substrate of the first exemplary semiconductor structure as a function of the depth from the top surface of the second-conductivity-type semiconductor layer.

Referring to FIG. 12, a vertical dopant concentration profile in the semiconductor substrate of the first exemplary semiconductor structure is shown as a function of the depth from the top surface of the second-conductivity-type semiconductor layer 14. A first dotted curve 131 present below the depth of 4.0 microns represent the original dopant concentration of the first conductivity type dopants in the semiconductor substrate layer 10 as originally provided. The level of the first dotted curve 131 represents the first dopant concentration.

A solid curve 132 having a plateau between the depth of 4.0 microns and the depth of 5.0 microns represents the contribution of the additional first conductivity type dopants introduced into the upper portion of the semiconductor substrate layer 10 by ion implantation to convert the upper portion into a first-conductivity-type semiconductor layer 12. Thus, the region between the depth of 4.0 microns and the depth of 5.0 microns correspond to the first-conductivity-type semiconductor layer 12. Thermal diffusion of the first conductivity type dopants from the first-conductivity-type semiconductor layer 12 generates the dopant concentration gradient (the sloped portions of the solid curve 132) at depths less than 4.0 microns and at depths greater than 5.0 microns. The concentration of dopants of the first conductivity type generates a retrograde profile at depths greater than 5.0 microns, i.e., a profile in which the dopant concentration of the first conductivity type decreases with depth.

A second dotted curve 133 having a plateau between the depth of 0 micron and the depth of 4.0 microns represents the contribution of the second conductivity type dopants present in the second-conductivity-type semiconductor layer 14. Because of inherent dopant diffusion that accompanies thermal processing steps employed to manufacture semiconductor devices, the second conductivity type dopants that are originally present in the second-conductivity-type semiconductor layer 14 diffuse downward.

Thus, without the added first conductivity type dopants provided by the first-conductivity-type semiconductor layer 12, i.e., in the absence of the solid curve 132, the semiconductor material at the bottom of the deep isolation trenches 11 can have a doping of the second conductivity type, and the electrical isolation between adjacent portions of the second-conductivity-type semiconductor layer 14 can be compromised, and a significant level of electrical leakage current may be present. For example, without the solid curve 132 that is present due to the first-conductivity-type semiconductor layer 12, the bottom portion of a deep isolation trench having a depth of 5.0 microns would be embedded within a semiconductor material having a doping of the second conductivity type, and different portions of the second-conductivity-type semiconductor layer would be electrically shorted.

The presence of the first-conductivity-type semiconductor layer 12 in the first exemplary semiconductor structure provides additional first conductivity type dopants, represented by the solid curve 132, so that the bottom portion of a deep isolation trench having a depth of 5.0 microns in the first exemplary semiconductor structure is embedded within a semiconductor material having a doping of the first conductivity type. Thus, the first-conductivity-type semiconductor layer 12 has the effect of raising the level of the p-n junction between a first conductivity type region underneath and a second conductivity type region above, and effectively electrically isolate each portion of the second-conductivity-type semiconductor layer 14. Further, because the additional first conductivity type dopants diffusing upward from the first-conductivity-type semiconductor layer 12 does not significantly affect the overall second conductivity type doping in the second-conductivity-type semiconductor layer 14, the outdiffusion of the first conductivity type dopants from the first-conductivity-type semiconductor layer 12 does not affect the conductivity of the various portions of the second-conductivity-type semiconductor layer 14 that function as outer electrodes of capacitors (17, 18, 14).

The first exemplary semiconductor structure of the present disclosure can be modified in many ways that does not affect the functionality of devices. Referring to FIGS. 13A and 13B, a second exemplary semiconductor structure according to the first embodiment of the present disclosure can be derived from the first exemplary semiconductor structure by employing a different material to completely fill the at least one deep isolation trench 11. Specifically, the at least one deep isolation trench 11 can be only partially filled with the conductive material that completely fills the deep capacitor trenches 13. Because the deep capacitor trenches 13 are narrower that a deep isolation trench 11, the thickness of the conductive material can be controlled so that all deep capacitor trenches 13 are completely filled with the conductive material, while a conductive material portion 16A including the conductive material only partially fills a deep isolation trench 11. The rest of the deep isolation trench(es) 11 can be filled with an additional material that can conformally fill high aspect ratio trenches. If the additional fill material is a dielectric material such as silicon oxide or silicon nitride, a dielectric material portion 16B can be formed within the deep isolation trench (es) 11. A pair of a conductive material portion 16A and a dielectric material portion 16B constitutes a deep isolation trench fill portion 16, which fills a deep isolation trench 11 with a dielectric liner 15.

Figure 14B:
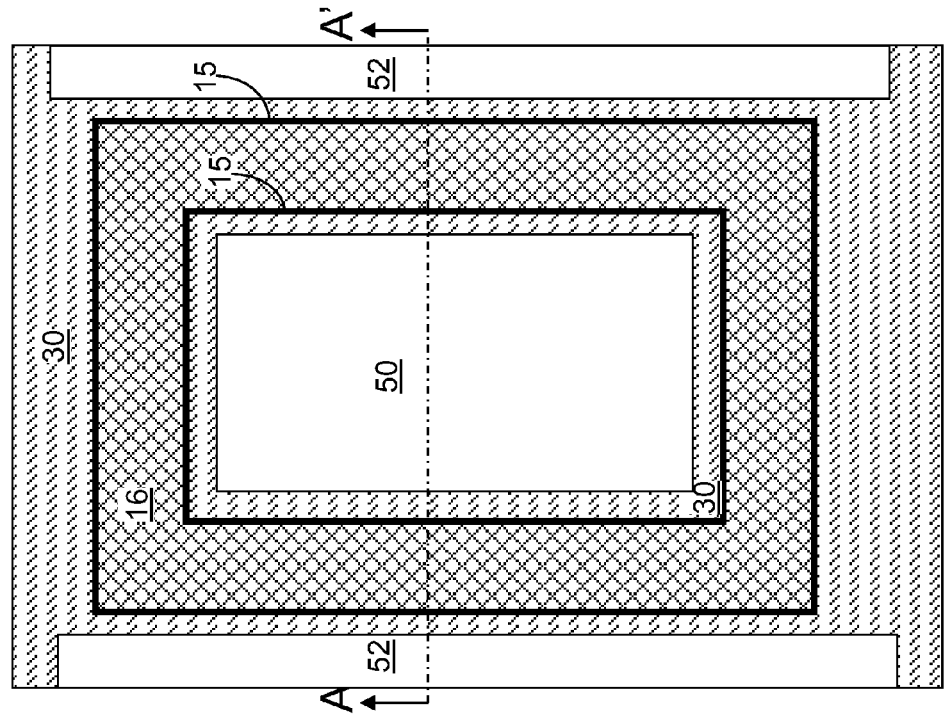
FIG. 14B is a top-down view of the third exemplary semiconductor structure of FIG. 14A according to the second embodiment of the present disclosure. The A-A' plane in FIG. 14B is the plane of the vertical cross-sectional view of FIG. 14A.
Figure 14A:
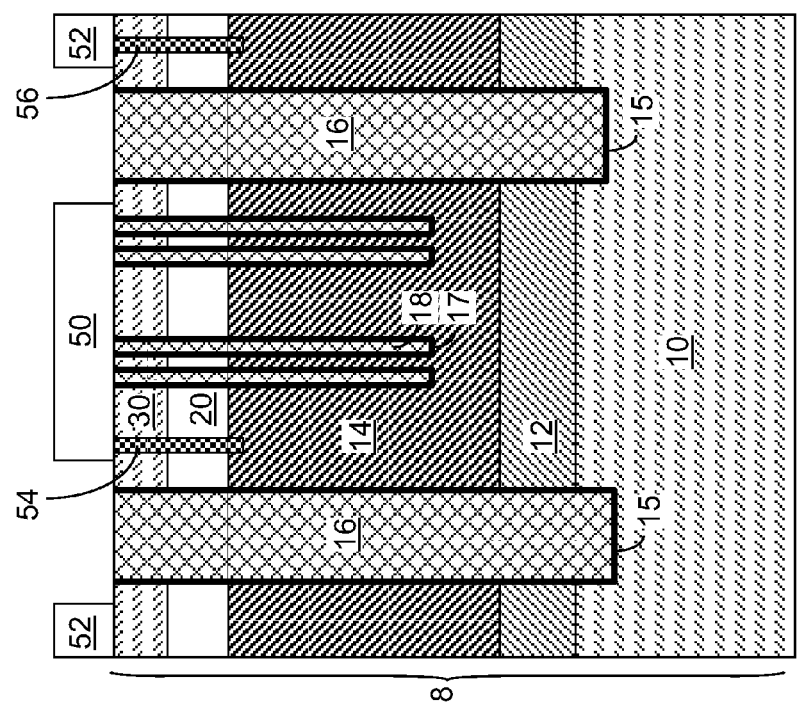
FIG. 14A is a vertical cross-sectional view of a third exemplary semiconductor structure according to the third embodiment of the present disclosure.

Referring to FIGS. 14A and 14B, a third exemplary semiconductor structure according to the first embodiment of the present disclosure can be derived from the first exemplary semiconductor structure by changing the first depth d1 (See FIG. 9A) of the at least one deep isolation trench 11. The first depth d1 can be adjusted independently of the second depth d2 (See FIG. 9A), for example, by increasing the minimum width w (See FIG. 8B) of the at least one deep isolation trench 11, or can be adjusted in conjunction with the second depth d2 by changing the etch time for the anisotropic etch employed to form the at least one deep isolation trench 11 and the deep capacitor trenches 13.

The at least one deep isolation trench 11 can extend through the second-conductivity-type semiconductor layer 14 and the first-conductivity-type semiconductor layer 12 so that the bottom surface(s) of the at least one deep isolation trench 11 contacts the semiconductor substrate layer 10. The bottom surface(s) of the at least one deep isolation trench 11 can be located in a retrograde profile region in which the dopant concentration of the first conductivity type dopants decrease with depth, or can be located in a lower portion of the semiconductor substrate layer 10 having a uniform dopant concentration, i.e., the first dopant concentration.

Figure 15B:
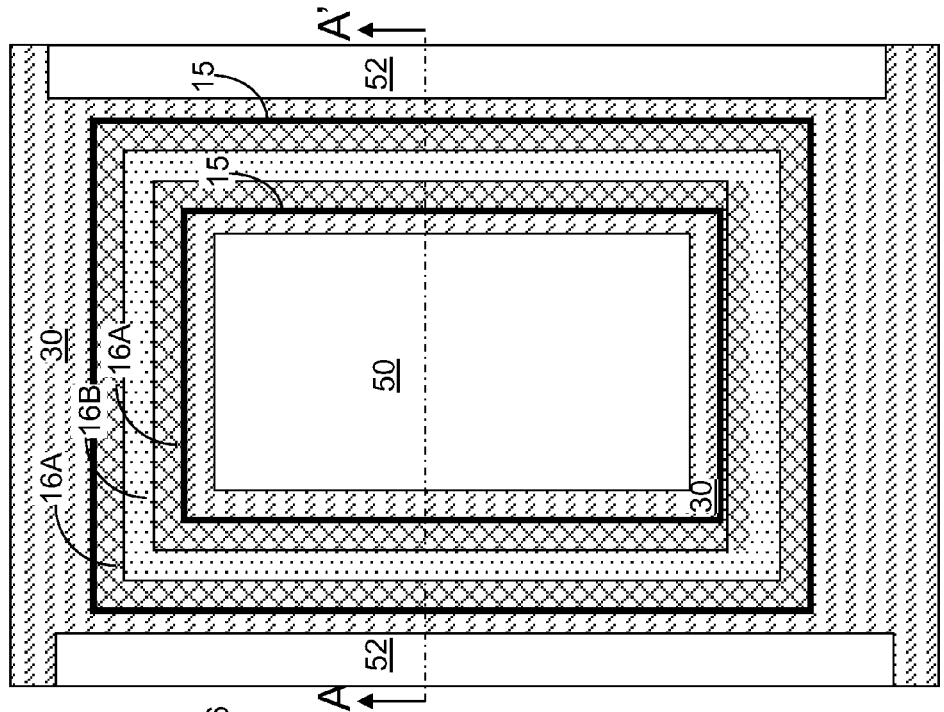
FIG. 15B is a top-down view of the fourth exemplary semiconductor structure of FIG. 15A according to the second embodiment of the present disclosure. The A-A' plane in FIG. 15B is the plane of the vertical cross-sectional view of FIG. 15A.
Figure 15A:
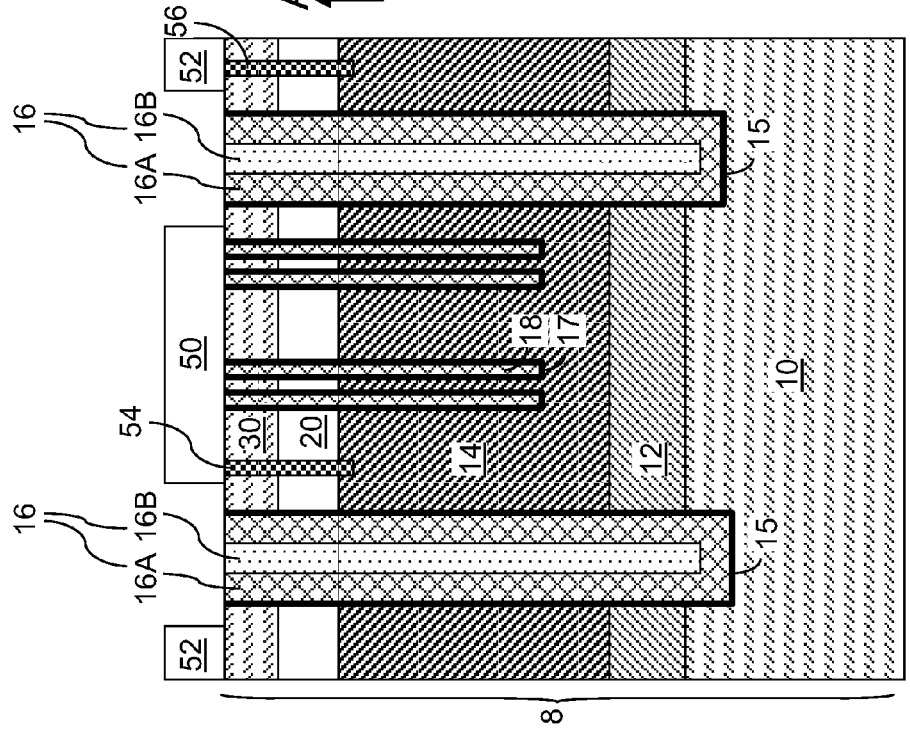
FIG. 15A is a vertical cross-sectional view of a fourth exemplary semiconductor structure according to the fourth embodiment of the present disclosure.

Referring to FIGS. 15A and 15B, the fourth exemplary semiconductor structure according to the fourth embodiment of the present disclosure can be derived from the second exemplary semiconductor structure by adding the variations of the third embodiment.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
   a semiconductor substrate including a vertical stack, from bottom to top, of at least a semiconductor substrate layer having a doping of a first conductivity type at a first dopant concentration at a lower portion thereof, a first-conductivity-type semiconductor layer having dopants of said first conductivity type at a second dopant concentration greater than said first dopant concentration, and a second-conductivity-type semiconductor layer having a doping of a second conductivity type that is the opposite of said first conductivity type;
   at least one deep trench capacitor comprising a node dielectric, an inner electrode, and a portion of said second-conductivity-type semiconductor layer, wherein said node dielectric is vertically spaced from said first-conductivity-type semiconductor layer; and
   a deep isolation trench vertically extending through said second-conductivity-type semiconductor layer and at least partly into said first-conductivity-type semiconductor layer.

2. The semiconductor structure of claim 1, wherein said deep isolation trench laterally surrounds said portion of said second-conductivity-type semiconductor layer.

3. The semiconductor structure of claim 2, wherein said portion of said second-conductivity-type semiconductor layer is an outer electrode of said at least one deep trench capacitor.

4. The semiconductor structure of claim 1, wherein said vertical stack further comprises:
a buried insulator layer contacting a top surface of said second-conductivity-type semiconductor layer; and
a top semiconductor layer contacting a top surface of said buried insulator layer.

5. The semiconductor structure of claim 4, further comprising at least one semiconductor device located on said top semiconductor layer.

6. The semiconductor structure of claim 4, further comprising at least one buried contact via structure extending through said top semiconductor layer and said buried insulator layer and contacting said second-conductivity-type semiconductor layer.

7. The semiconductor structure of claim 1, further comprising a dielectric liner contacting an entirety of sidewalls and a bottom surface of said deep isolation trench and having a same composition as said at least one node dielectric.

8. The semiconductor structure of claim 7, further comprising a deep isolation trench fill portion contacting inner sidewalls of said dielectric liner and comprising a conductive material portion having a same composition as said at least one inner electrode.

9. The semiconductor structure of claim 8, wherein said dielectric liner and said conductive material portion completely fills said deep isolation trench.

10. The semiconductor structure of claim 8, wherein said deep isolation trench fill portion further comprises a dielectric material portion embedded within said conductive material portion.

11. The semiconductor structure of claim 1, wherein said second-conductivity-type semiconductor layer has a doping of said second conductivity type at a third dopant concentration that is greater than said second dopant concentration.

12. The semiconductor structure of claim 1, wherein an upper portion of said semiconductor substrate layer has a retrograde dopant concentration profile in which a dopant concentration of first conductivity type dopants decreases from said second dopant concentration to said first dopant concentration.

13. A method of forming a semiconductor structure comprising:
forming a vertical stack, from bottom to top, of at least a semiconductor substrate layer having a doping of a first conductivity type at a first dopant concentration at a lower portion thereof, a first-conductivity-type semiconductor layer having dopants of said first conductivity type at a second dopant concentration greater than said first dopant concentration, and a second-conductivity-type semiconductor layer having a doping of a second conductivity type that is the opposite of said first conductivity type;
forming at least one deep trench capacitor within said vertical stack, wherein each of said at least one deep trench capacitor comprises a node dielectric, an inner electrode, and a portion of said second-conductivity-type semiconductor layer, wherein said node dielectric is vertically spaced from said first-conductivity-type semiconductor layer; and
forming a deep isolation trench vertically extending through said second-conductivity-type semiconductor layer and at least partly into said first-conductivity-type semiconductor layer.

14. The method of claim 13, wherein said deep isolation trench is formed in a pattern that laterally surrounds said portion of said second-conductivity-type semiconductor layer.

15. The method of claim 13, further comprising forming a stack of a buried insulator layer and a top semiconductor layer directly on said second-conductivity-type semiconductor layer, wherein said buried insulator layer contacts a top surface of said second-conductivity-type semiconductor layer.

16. The method of claim 15, further comprising forming at least one buried contact via structure through said top semiconductor layer and said buried insulator layer, wherein said at least one buried contact via structures contacts said second-conductivity-type semiconductor layer.

17. The method of claim 13, wherein said second-conductivity-type semiconductor layer is epitaxially grown on a top surface of said first-conductivity-type semiconductor layer.

18. The method of claim 13, wherein said first-conductivity-type semiconductor layer is formed by implanting dopants of said first conductivity type into an upper portion of said semiconductor substrate layer, wherein said upper portion is converted into said first-conductivity-type semiconductor layer.

19. The method of claim 13, wherein a dielectric liner contacting an entirety of sidewalls and a bottom surface of said deep isolation trench is deposited within said deep isolation trench concurrently with formation of said at least one node dielectric.

20. The method of claim 19, wherein a deep isolation trench fill portion that contacts inner sidewalls of said dielectric liner is deposited within said deep isolation trench concurrently with formation of said at least one inner electrode.

* * * * *